(12) United States Patent
Kamp-Froese et al.

(10) Patent No.: US 11,927,888 B2
(45) Date of Patent: Mar. 12, 2024

(54) METHOD FOR THE TRACKING AND IDENTIFICATION OF COMPONENTS OF LITHOGRAPHY SYSTEMS, AND LITHOGRAPHY SYSTEM

(71) Applicant: Carl Zeiss SMT GmbH, Oberkochen (DE)

(72) Inventors: Michael Kamp-Froese, Aalen (DE); Claudia Woersching, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 23 days.

(21) Appl. No.: 17/811,937

(22) Filed: Jul. 12, 2022

(65) Prior Publication Data

US 2022/0342320 A1 Oct. 27, 2022

Related U.S. Application Data

(63) Continuation of application No. PCT/EP2021/051931, filed on Jan. 28, 2021.

(30) Foreign Application Priority Data

Feb. 3, 2020 (DE) .......................... 102020201264.4

(51) Int. Cl.
*G03F 7/00* (2006.01)
*G06K 19/07* (2006.01)

(52) U.S. Cl.
CPC ...... *G03F 7/70541* (2013.01); *G03F 7/70975* (2013.01); *G06K 19/0723* (2013.01)

(58) Field of Classification Search
CPC ............ G03F 7/70541; G03F 7/70975; G06K 19/0723; G06K 19/00; G06K 19/07
(Continued)

(56) References Cited

U.S. PATENT DOCUMENTS 7,259,675 B2   8/2007   Baker
8,387,887 B2   3/2013   Kube
(Continued)

FOREIGN PATENT DOCUMENTS

DE   102017217266 A1   3/2019
JP   2005-215508 A     8/2005
WO   WO 2005/069055 A2  7/2005

OTHER PUBLICATIONS

International Search Report and Written Opinion for corresponding PCT Appl No. PCT/EP2021/051931, dated Mar. 12, 2021.
(Continued)

*Primary Examiner* — Edwyn Labaze
(74) *Attorney, Agent, or Firm* — Fish & Richardson P.C.

(57) ABSTRACT

A method for the tracking and identification of components of lithography systems, for example of projection exposure apparatuses for semiconductor lithography is provided. The components are each provided with at least one transponder. The transponder has a data memory, on which data relating to the respective component are stored. The transponder is configured to pick up wirelessly arriving signals of a reader and to respond with data from the data memory. The data are stored on the data memory during the production of the component and/or during the production of the lithography system and/or after the start-up of the lithography system.

21 Claims, 6 Drawing Sheets

(58) Field of Classification Search
USPC .................................. 235/492, 380, 487, 375
See application file for complete search history.

(56) References Cited

U.S. PATENT DOCUMENTS

| | | |
|---|---|---|
| 10,121,140 B2 | 11/2018 | Sperduti |
| 11,187,989 B2 | 11/2021 | Laufer |
| 2006/0235488 A1* | 10/2006 | Nycz ..................... A61B 90/90 607/2 |
| 2008/0269945 A1 | 10/2008 | Lai |
| 2008/0291026 A1* | 11/2008 | Schwarze ............ H01Q 1/2225 340/572.7 |
| 2009/0234517 A1 | 9/2009 | Feullebois et al. |
| 2013/0049349 A1* | 2/2013 | Feder ................ G06K 19/0776 156/247 |
| 2014/0244833 A1* | 8/2014 | Sharma ................ H04L 12/281 709/224 |
| 2020/0000548 A1* | 1/2020 | Aquino ................. G06K 19/02 |

OTHER PUBLICATIONS

German Office Action, with translation thereof, for corresponding Appl No. 10 2020 201 264.4, dated Sep. 10, 2020.

* cited by examiner

METHOD FOR THE TRACKING AND IDENTIFICATION OF COMPONENTS OF LITHOGRAPHY SYSTEMS, AND LITHOGRAPHY SYSTEM

CROSS-REFERENCE TO RELATED APPLICATIONS

The present application is a continuation of, and claims benefit under 35 USC 120 to, international application PCT/EP2021/051931, filed Jan. 28, 2021, which claims benefit under 35 USC 119 of German Application No. 10 2020 201 264.4, filed Feb. 3, 2020. The entire disclosure of these applications are incorporated by reference herein.

FIELD

The disclosure relates to a method for the tracking and identification of components of lithography systems, for example of projection exposure apparatuses for semiconductor lithography. The disclosure also relates to a lithography system, for example a projection exposure apparatus for semiconductor lithography, comprising an illumination system with a radiation source and an optical unit having a plurality of components.

BACKGROUND

Lithography systems, for example projection exposure apparatuses for semiconductor lithography, have a large number of components, which can in turn comprise a large number of subcomponents.

For the tracking and identification of the components, it is known for the components to be provided with a number of a merchandise management system. In this case, the number of the merchandise management system can be applied to the components by engraving or embossing. The information content that can be obtained directly from the number of the merchandise management system is limited, however.

Lithography systems, for example projection exposure apparatuses, can have an individualized configuration or a customized configuration, which can mean that the components are likewise configured in an individualized or customized manner. By way of example, on account of customer-specific wishes or an individualization, the processing of a component for a specific lithography system may deviate from the customary processing of the component or the component may have incorporated in it subcomponents whose type, arrangement or configuration deviates from the subcomponents that are usually incorporated in the component.

In general, such deviations cannot be inferred, or can be inferred only to a limited extent, from the number of the merchandise management system.

Furthermore, it is possible for lithography systems, for example projection exposure apparatuses, to have components whose properties differ, within the specifications, from the properties of the components of the same type which are used in other lithography systems or projection exposure apparatuses. However, such components have the same number in the merchandise management system.

In the case of lithography systems, for example in the case of projection exposure apparatuses, it can be desirable for there to be rapid action after they have been installed for the customer, e.g. in the event of maintenance and for example also in the event of error messages occurring. For this purpose, it can be desired for problems to be rapidly identified and appropriately solved by the service personnel on site. In this case, it may be desirable for the service personnel to rapidly have available information concerning the component. This information also includes information about individualized or customized adaptations or information about deviating properties of the component (within the specification).

It has proved to be typically complicated to obtain the aforementioned information on the basis of the number of the merchandise management system. This usually involves the service personnel establishing a connection to various databases on the basis of the number of the merchandise management system in order to obtain more specific information concerning production, individualization, customized adaptations or further properties of the component. It is often not possible for the customers to retrieve such data on site, for example not in the environment in which lithography systems, for example projection exposure apparatuses, are operated. Projection exposure apparatuses are usually operated in clean rooms or in a vacuum environment, which results in corresponding restrictions. It is often also not possible or not straightforwardly possible or not allowed to make written notes or to use USB sticks or other hard disk storage devices.

With regard to the individualization or the customized manufacture of a lithography system, for example of a projection exposure apparatus for semiconductor lithography, it may be desirable as early as during production if simple measures are taken to ensure that an individualized component or a component configured in a customized manner is incorporated into the correct lithography system or the correct projection exposure apparatus or the components are delivered to the correct customer. The desired properties mentioned above apply for example to projection exposure apparatuses for semiconductor lithography, but are also relevant for other lithography systems, for example also for devices for the inspection and repair of photolithographic masks in the semiconductor industry and for devices and systems for process control in the semiconductor industry.

An issue associated with the tracking and identification of components of lithography systems, for example of projection exposure apparatuses for semiconductor lithography, is that projection exposure apparatuses, for example, are operated in clean rooms or in a vacuum environment, and so the accessibility to the components, for example also for the purpose of reading off the embossed number of the merchandise management system, is restricted. For these reasons, the use of a barcode is also suitable only to a limited degree, since it cannot reliably be ensured that the barcode, for example after the projection exposure apparatus has been installed for the customer, can be read out by a barcode reader.

Moreover, with barcodes although additional information can be stored on them, it is desirable, if a large amount of information is intended to be communicated, for the reader to establish a connection to further databases, for example in order also to be able to retrieve information concerning certain subcomponents or the like. Furthermore, with barcodes once the barcode has been created, it can no longer be altered. That is to say that it may not be possible for additional information that has arisen e.g. during the production of the component, or service information, for example, to be recorded on the barcode. That is to say that e.g. in the event of maintenance or in the event of an error occurring, the service personnel may not directly obtain all involved information concerning the component on site.

SUMMARY

The present disclosure seeks to improve the tracking and identification of components of lithography systems, for example of projection exposure apparatuses for semiconductor lithography.

The present disclosure also seeks to provide a lithography system, for example a projection exposure apparatus, in which the tracking and identification of components is improved.

In an aspect, the disclosure provides a method for the tracking and identification of components of lithography systems, for example of projection exposure apparatuses for semiconductor lithography. The components are each provided with at least one transponder, following which the transponder has a data memory, on which data relating to the respective component are stored. The transponder is configured to pick up wirelessly arriving signals of a reader and to respond with data from the data memory. The components of the lithography system which are provided with the transponder are mechanical components having no electrical parts and/or no power supply. The data are stored on the data memory during the production of the component and/or during the production of the lithography system and/or after the start-up of the lithography system.

In an aspect, the disclosure provides a lithography system, for example projection exposure apparatus for semiconductor lithography, comprising an illumination system with a radiation source and an optical unit having a plurality of components. At least one of the components is provided with at least one transponder. The transponder has a data memory, on which data relating to the respective component are stored, and the transponder is configured to pick up wirelessly arriving signals of a reader and to respond with data from the data memory. The components of the lithography system which are provided with the transponder are mechanical components having no electrical parts and/or no power supply. The data are stored on the data memory during the production of the component and/or during the production of the lithography system and/or after the start-up of the lithography system.

The method according to the disclosure for the tracking and identification of components of lithography systems, for example of projection exposure apparatuses for semiconductor lithography, provides for the components each to be provided with at least one transponder, following which the transponder has a data memory, on which data relating to the respective component are stored, and the transponder is configured to pick up wirelessly arriving signals of a reader and to respond with data from the data memory.

The inventors have recognized that the aforementioned method, for example the use of a transponder, is for example suitable for enabling tracking and identification of components in the case of a lithography system, for example in the case of a projection exposure apparatus for semiconductor lithography.

In comparison with a number of a merchandise management system and also in comparison with a barcode, such transponders can have have a data memory, on which all relevant information can be stored directly, such that the service personnel, for example for maintenance or repair purposes, can retrieve the relevant data directly on site, without having to leave a clean room and/or a vacuum environment. Maintenance or repair measures can thus be carried out in an accelerated manner.

The data memory makes it possible to store even complex or detailed data of the component and also the subcomponents thereof, for example also with regard to an individualization and/or customized features.

In order to design the data memory of the transponder in such a way that the latter can store all relevant data, in the context of the disclosure provision can be made for firstly checking which data are intended to be stored on the data memory.

In some embodiments, the method according to the disclosure, moreover, provides that the data can be retrieved in a simple manner even in a clean room or a vacuum environment, without the service personnel having to optically read a barcode or a number of the merchandise management system engraved into the component, which is possibly not possible or possible only with difficulty on account of the installation situation of the component.

The disclosure provides for the transponder to respond to wirelessly arriving signals of the reader with data from the data memory, such that it is possible for the data to be read out even without a direct line of sight.

The transponder can be configured in such a way that in the course of the production of the component and/or of the lithography system, optionally, data are repeatedly stored or updated on the data memory. As a result, it is also possible, in a simple manner, to check whether the correct component was incorporated into the lithography system.

In the context of the method according to the disclosure, provision can be made for an arbitrary number of components of lithography systems, for example of projection exposure apparatuses for semiconductor lithography, to be provided with a transponder. In this case, in the context of the disclosure, provision can also be made for only one component to be provided with a transponder. Optionally, a plurality of components are provided with a transponder. It goes without saying that provision can also be made for all of the components, for example certain components, and for example components having a plurality of subcomponents, to be provided with a transponder.

It can be desirable for the signals of the reader to be transmitted wirelessly or contactlessly, without the need for an optical line of sight to the transponder. The signals of the reader can be transmitted by radio.

It can be desirable, moreover, if a passive transponder is used as transponder.

The use of a passive transponder has proved to be for example suitable since such transponders do not have to have their own energy source. Passive transponders obtain the energy from the signal of the reader. By using a passive transponder, it is not necessary to ensure that the transponder has its own energy source or an external connection to an energy source. This has proved to be for example suitable for the tracking and identification of components of lithography systems, for example of projection exposure apparatuses for semiconductor lithography, which are operated in a clean room and/or a vacuum environment. For example in the case of projection exposure apparatuses for semiconductor lithography, on account of the evolution of heat that energy sources can generate, it is possible to dispense with energy sources, insofar as possible.

By using a passive transponder as transponder additionally ensures that the functionality of the transponder is not dependent on a charged, integrated energy source. Furthermore, disturbances caused by the energy source during the operation of the lithography system are avoided.

The transponder can be configured to store data arriving via the signals of the reader and/or a transmitter as desired on the data memory.

This configuration of the transponder makes it possible for data to be repeatedly stored on the data memory. This may be desirable in the course of the production of the component or of the lithography system, for example, in order to record on the data memory which production steps have already been performed or implemented; optionally, corrections can also be recorded. For this purpose, optionally, a transmitter can be used which stores data on the data memory optionally automatically or as desired. The transmitter can be embodied independently or else as a part of a production machine. Optionally, a plurality of production machines can have corresponding transmitters.

Furthermore, the service personnel also have the opportunity to store data on the data memory of the transponder, for example relating to maintenance or service measures carried out. For this purpose, optionally, the reader can be correspondingly configured for transmitting the data.

The reader is configured to transmit data. The reader is optionally configured in such a way that data transmitted back from the transponder can be read from the data memory and also data can be transmitted to the data memory. The reader is thus configured both for reading data from the data memory and for writing data thereto or accordingly corresponds to the transponder.

According to the disclosure, provision can furthermore be made for the data to be stored on the data memory during the production of the component and/or during the production of the lithography system and/or after the start-up of the lithography system.

Provision can be made for the data to be stored on the data memory at any desired point in time. The storage of data on the data memory during the production of the component and/or during the production of the lithography system, optionally in such a way that the data are stored on the data memory automatically, for example by the corresponding machine provided for production, has proved to be for example suitable. Furthermore, it has proved to be suitable if data are stored on the data memory of the transponder also after the start-up of the lithography system, for example for repair, service or maintenance purposes and/or also when correcting errors.

The data can be stored repeatedly on the data memory during the production of the component and/or during the production of the lithography system and/or after the start-up of the lithography system.

The method step mentioned above enables the data on the data memory to be continuously updated or kept up to date.

According to the disclosure, provision can furthermore be made for one or more of the following items of information to be stored in the data memory:

data concerning the identification of the type of component;
actual data of the production of the component;
data relating to an individualization and/or a customized adaptation of the component;
data relating to the association with the component with a specific lithography system, for example an individualized lithography system and/or a lithography system configured in a customized manner;
data relating to properties of the component with which the latter deviates from other components of the same type within the specifications;
measurement data of the component;
data relating to a general overhaul, an improvement, a conversion, a renovation or a retrofitting of the component;
data relating to the service, the start-up, the repair and/or the maintenance of the component;
data relating to production steps of the component;
data relating to the material or materials of the component;
data relating to the calibration of the component;
data relating to the processing of the component;
data relating to production features;
data relating to product features;
data relating to subcomponents of the component;
data relating to the hardware of the component and/or the type, the configuration, the arrangement, the processing or the state of the subcomponents of the component;
data relating to suppliers;
data relating to customers;
data relating to additional information;
the number of the component allocated in a merchandise management system;

and/or following which one, a plurality or all of the aforementioned data are also stored on the data memory for one subcomponent, a plurality of subcomponents, a group of subcomponents or all of the subcomponents of the component.

The items of information mentioned above are for example suitable for storage in the data memory.

Selected information, for example certain production steps, production information, values, and the numbers of the component and the subcomponents thereof which are allocated in the context of a merchandise management system can be stored in the data memory. Irrespective of how complex the production process is, the data memory makes it possible to store all information relevant to the component and the subcomponents thereof.

It is possible to store on the data memory data relating to an individualization and/or a customized adaptation of the component and the subcomponents; for example, it is possible to store which subcomponents were used in the component, for example the type, the processing, the state and the number of the subcomponents used, their configuration and arrangement.

It is possible here to record on the data memory if the hardware of the component and/or the used subcomponents of the component deviate(s) from other components of the same type, for example with regard to material, processing (for example with regard to the grinding or polishing processes), tolerances or further production features, for example production features classified relevant to the component or the subcomponents thereof. Furthermore, it may be possible to record on the data memory which suppliers have supplied or processed, if appropriate, parts of the component, for example the subcomponents thereof.

According to the disclosure, provision can furthermore be made for the data to be read from the data memory during the production of the component and/or during the production of the lithography system and/or after the start-up of the lithography system.

The method according to the disclosure makes it possible, independently of the complexity of the production of the component or of the lithography system, to read information from the data memory in order to reduce production problems, for example also in order to ascertain which production steps have already been carried out or to ascertain the status of the production of the component or of the lithography system. By reading out the data during production, it is also possible to ensure that the correct component is used for an individualized lithography system and/or a lithography system adapted in a customized manner.

According to the disclosure, provision can furthermore be made for the data to be read out for service purposes and/or in the event of overhaul and/or in the event of repair and/or in the event of maintenance and/or in the event of error messages and/or during the production process in order to ascertain which components have already been installed and/or in order to ascertain what status the component has, and/or in order to ascertain whether a specific lithography system has been provided with the associated components.

Reading out the data for the purposes or at the points in time mentioned above has proved to be for example suitable.

Reading out the data after start-up, for the purposes mentioned above, enables the service personnel to process the service, the overhaul, the repair, the maintenance or else the error message as rapidly as possible, since all desired information regarding the component is directly available.

A typical error message may consist for example in the lithography system reporting that component X has an error. Afterwards, the service personnel can then read the data memory of component X in order to obtain further information, for example the information and data mentioned above and below, about component X and the subcomponents thereof.

Reading out the data during the production process in order to ascertain which components have already been installed or else which subcomponents of a specific component have already been installed has proved to be suitable in order to optimize the production process. It has furthermore proved to be suitable if the status of the component can be checked during the production process, for example in order to ascertain which production steps, for example grinding or polishing, have already been carried out or how far they have progressed. Furthermore, it has proved to be helpful to check as early as during the production process whether a specific lithography system, i.e. a lithography system that is individually adapted or adapted in a customized manner, has been provided with the associated components.

The method according to the disclosure can enable or simplify automated production by virtue of the fact that it is possible at any time to read whether the specifically provided component, i.e. the correct component, also having the correct subcomponents, has been installed. The components of the lithography system can thus be identified in a simple manner.

The transponder can be secured to the component by a method suitable for a vacuum environment and/or a clean room.

For example if the transponder is intended to be used in the case of a projection exposure apparatus for semiconductor lithography, the transponder can be secured by a method to the component which is suitable for a vacuum environment and/or a clean room. For example cohesive connections, for example adhesive bonding, but also positively locking and/or force-locking connections, as long as they are suitable for a vacuum environment and/or a clean room, may be suitable for this purpose.

The securing of the transponder to the component can optionally be effected by the transponder being embedded or incorporated into the component. The transponder can also be connected to the component or be secured or attached thereto in some other way.

According to the disclosure, provision can furthermore be made for a mechanical protection to be applied to at least one portion of the outer surfaces of the transponder, for example for the transponder to be potted or a coating to be applied to the transponder.

The inventor has recognized that when the transponder is used in a vacuum environment and/or a clean room, it is for example suitable if the transponder has a mechanical protection. This can optionally be realized by a coating being applied to the transponder. Optionally, in this case, at least portions of the outer surface of the transponder are provided with the coating. Optionally, the transponder is enclosed by the coating on all outer surfaces, i.e. completely. In this case, provision can also be made for a coating to be applied only on the outer surfaces of the transponder that do not adjoin the component. All materials suitable for use in a vacuum environment and/or in a clean room are suitable as coating.

According to the disclosure, provision can be made for the outer surfaces of the transponder to be provided with a powder coating.

According to the disclosure, provision can furthermore be made to the effect that, in order to prepare the transponder for a clean room, said transponder is immersed in one or more cleaning solutions or treated therewith, optionally after the transponder has been appropriately coated.

Instead of a coating, optionally, a lacquering or the like can also be provided.

One possibility for applying a mechanical protection to the transponder may also consist in potting the transponder.

The components of the lithography system which are provided with the transponder can be mechanical components having no electrical parts and/or no power supply.

It has proved to be for example suitable to use the method according to the disclosure in the case of components of the lithography system which are purely mechanical components having no electrical parts and/or no power supply. It goes without saying that the term mechanical components also includes optical components, for example mirrors and lens elements. The mechanical components can also be, for example, frames or mounts for the mirrors or the optical units. It has proved to be for example suitable, for example, to use passive transponders in the case of these mechanical components since a disturbance caused by an energy source is thus precluded.

According to the disclosure, provision can furthermore be made for at least one portion of the data stored on the data memory to be stored in an encoded manner.

The reader can optionally be configured to decrypt the data received from the transponder. Furthermore, according to the disclosure, provision can be made for the reader to be configured so that the data which are intended to be written to the data memory are transmitted in an encoded manner.

Encoding the data firstly serves for data protection and secondly reduces the risk of manipulation of the data. Encoding the data furthermore also makes it possible to reduce the volume of data and to increase the performance of the system. In this case, provision can also be made, for example, for storing for example error messages, for example an "Error Code", only numerically or alphanumerically, without an additional descriptive text. Furthermore, numerical or alphanumerical storage can be provided in order to address specific measures for the service personnel, for example service or repair measures, such as, for example, planned inspections or a change of the component. Furthermore, service measures carried out can also be stored on the data memory in this way.

By virtue of the fact that the decryption or the encryption is effected directly on the reader or a mobile data device that communicates therewith, e.g. a laptop or a mobile phone, for example the service personnel can read the data or the information, without the need for an additional connection to a data network, for example.

The information of the data memory read by the reader can optionally be displayed on a computer, for example a laptop, or else on a mobile phone. The decryption can be effected here both on the reader and on the computer or the mobile phone.

According to the disclosure, provision can furthermore be made for the data read out by the reader to be transmitted to a data network and/or for additional information concerning the component to be retrieved from the data network.

In the context of the method according to the disclosure, provision can be made for the data read by the reader to be transmitted to a data network, such that the information in the data network can be updated or correlated with the data of the data memory.

In addition, provision can also be made for the reader to retrieve additional information concerning the component from the data network. In this case, it is also possible to compare whether the information in the data network and the information from the data memory correspond.

According to the disclosure, provision can be made for the data transfer between the reader and the data network to be effected in an automated manner. In this case, provision can be made for the data transfer to be effected directly, i.e. during or after the reading of data from the data memory of the transponder by the reader. For example if, as is the case in many clean rooms or vacuum environments in the course of operation of the lithography system or the projection exposure apparatus, a data connection from the clean room or the vacuum environment to the data network cannot be established, data transfer can also be effected at a later point in time. In this case, the transmitted data can optionally be encrypted.

In the context of the disclosure, an automatic transfer of data can be provided if the service personnel inspects an installed lithography system, for example a projection exposure apparatus, for service, maintenance, installation or repair purposes or if an error message has arisen.

Furthermore, provision can be made for the data retrieved from the data memory to be transmitted automatically to a data network that stores production data.

Furthermore, during the production of the component or of the lithography system, provision can be made for data to be transferred automatically from the data network that includes production data to the data memory. In this case, provision can also be made for a production machine provided for producing the component or for processing the component or the lithography system to store production data on the data memory of the transponder as desired or optionally automatically.

Data acquired during the production of the component and/or the production of the lithography system can be stored in the data network and/or the data memory and are transmitted to the reader as desired or automatically.

In the context of the disclosure, provision can be made for a component or the subcomponents thereof to be processed or subjected to different processing steps on different production machines. In this case, provision can be made for data from a plurality of production machines or from a plurality of processing steps to be stored on the data memory, optionally during or after the corresponding production or processing steps or when the component leaves a production machine.

In the context of the method according to the disclosure, provision can be made for the production machines to have a scanner for reading data from the data memory and/or a transmitter or a unit configured to store data in the data memory or transmit data to the transponder for this purpose. A corresponding station can be integrated into the production machine in order to store data on the data memory of the transponder and/or to transmit data into the data network automatically or as desired.

During the production of the component or of the lithography system, provision can be made, as desired or in an automated manner, for the data of the data memory to be read out, for example also in order to carry out a double check of the allocated number of the component in the context of the merchandise management system. Furthermore, it is possible to identify components for which individual processing steps or subcomponents are possibly outside tolerance, but which nevertheless overall are within tolerance, e.g. on account of a for example high accuracy of other processing steps or subcomponents which influence the overall consideration. Furthermore, during the production of a component, it is possible to check the previous development steps thereof or else possible renovation or modernization work on the component. Furthermore, by reading out data during production, it is possible to perform a double check of whether the production steps provided, for example production steps that are not straightforwardly visually discernible, have been carried out, for example whether the polishing has been concluded, whether the customized subcomponents have been installed or whether small and very small parts have already been correspondingly mounted. Furthermore, it is possible to check whether all subcomponents or further individual parts, of which a component may possibly have thousands, have already been mounted, or which parts are still missing.

The checks mentioned above can optionally be carried out repeatedly.

After the installation of the lithography system for a customer or after start-up, the service personnel can perform a check of whether all components have the corresponding subcomponents. Furthermore, by reading the data memories, it is possible for a concrete component to be identified and for its specific features to be read out rapidly and simply. In this case, the specific features can also be data and information stored during the production of the component. Furthermore, it is also possible to retrieve from the data memory of the transponder data which can reveal when the last service measures were carried out, for example with an indication of the date and the measures carried out. The same also applies to data relating to the overhaul, the maintenance, the repair or possible measures for correcting errors.

The corresponding data can optionally be transmitted to the data network by the reader or, connected thereto, the computer or the mobile phone or some other mobile terminal.

According to the disclosure, provision can furthermore be made for a transponder designed for near field communication, for example an RFID transponder, to be used as transponder.

The design of the transponder in such a way that the latter is suitable for near field communication, for example the design of the transponder as an RFID transponder, has proved to be for example suitable. Such transponders can be secured on the component and coated in such a way that they are suitable for use in clean rooms or a vacuum environment.

The disclosure furthermore relates to a lithography system, for example a projection exposure apparatus for semiconductor lithography, comprising an illumination system with a radiation source and an optical unit having a plurality of components, wherein at least one of the components is provided with at least one transponder, wherein the transponder has a data memory, on which data relating to the respective component are stored, and the transponder is configured to pick up wirelessly arriving signals of a reader and to respond with data from the data memory, wherein the components of the lithography system which are provided with the transponder are mechanical components having no electrical parts and/or no power supply.

According to the disclosure, provision can be made for at least some of the components to be embodied as optical elements.

The disclosure is suitable for example for use with a microlithographic DUV (Deep Ultra Violet) projection exposure apparatus and very for example suitable for use with a microlithographic EUV projection exposure apparatus. A possible use of the disclosure also relates to immersion lithography.

The disclosure is also suitable, for example, for devices for inspection and repair of photolithographic masks in the semiconductor industry and for devices and systems for process control in the semiconductor industry.

It goes without saying that features which have been described in association with the method according to the disclosure are also implementable for the lithography system according to the disclosure, for example the projection exposure apparatus for semiconductor lithography according to the disclosure—and vice versa. Furthermore, features which have already been mentioned in association with the method according to the disclosure can also be understood in relation to the lithography system, for example the projection exposure apparatus for the semiconductor lithography, and vice versa.

It should supplementarily be pointed out that terms such as "comprising", "having" or "with" do not exclude other features or steps. Further, terms such as "a(n)" or "the" which indicate single steps or features do not preclude a plurality of features or steps—and vice versa.

Exemplary embodiments of the disclosure are described in greater detail below with reference to the drawing.

The figures in each case show exemplary embodiments in which individual features of the present disclosure are illustrated in combination with one another. Features of an exemplary embodiment are also able to be implemented independently of the other features of the same exemplary embodiment, and may readily be combined accordingly by a person skilled in the art to form further expedient combinations and sub-combinations with features of other exemplary embodiments.

In the figures, functionally identical elements are provided with the same reference signs.

BRIEF DESCRIPTION OF THE DRAWINGS

Schematically.

EXEMPLARY EMBODIMENTS

Figure 1:
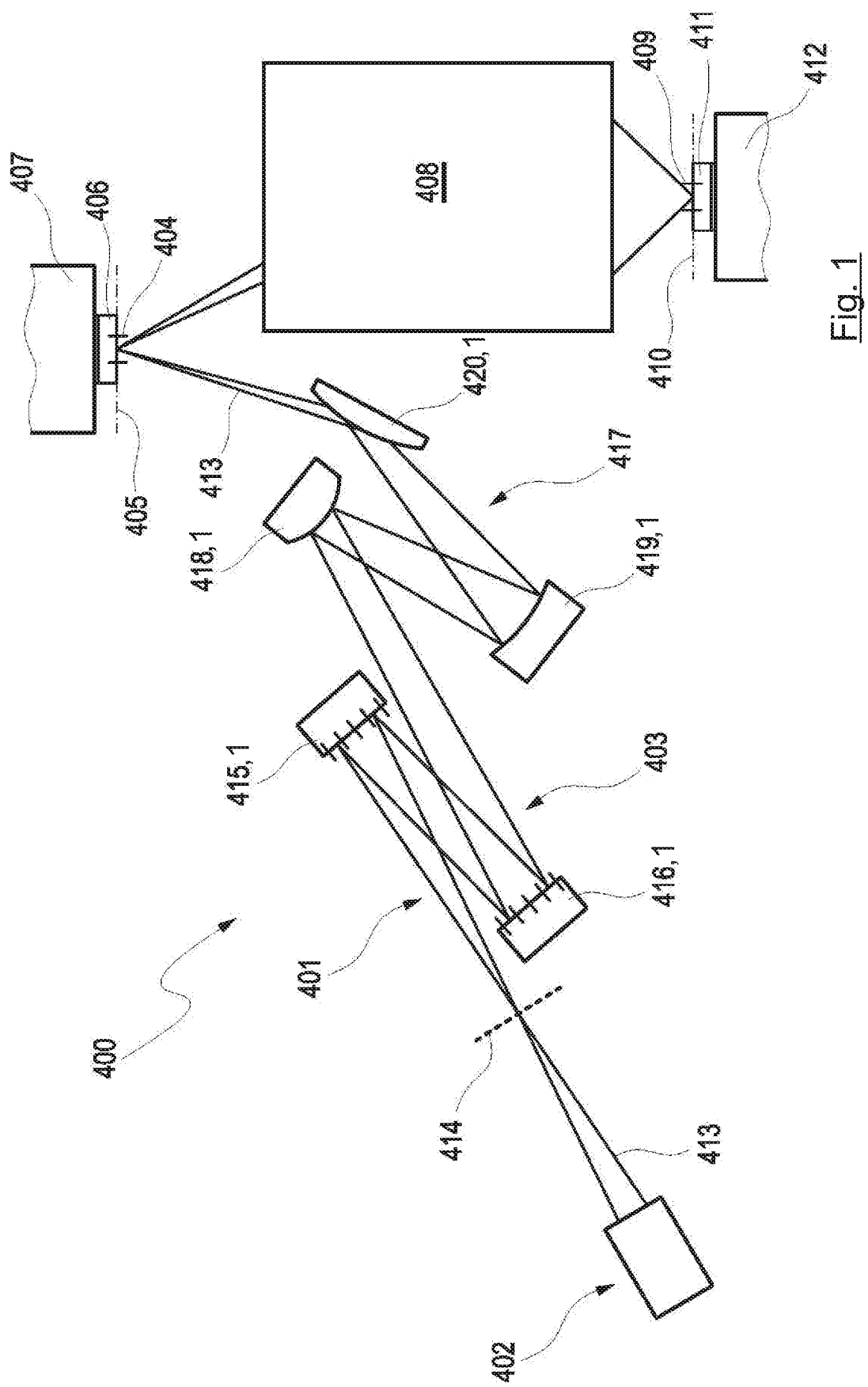
FIG. 1 shows an EUV projection exposure apparatus.

FIG. 1 shows by way of example the basic set-up of an EUV projection exposure apparatus 400 for semiconductor lithography for which the disclosure can find application. An illumination system 401 of the projection exposure apparatus 400 comprises, besides a radiation source 402, an optical unit 403 for the illumination of an object field 404 in an object plane 405. A reticle 406 arranged in the object field 404 is illuminated, said reticle being held by a reticle holder 407, illustrated schematically. A projection optical unit 408, illustrated merely schematically, serves for imaging the object field 404 into an image field 409 in an image plane 410. A structure on the reticle 406 is imaged on a light-sensitive layer of a wafer 411 arranged in the region of the image field 409 in the image plane 410, said wafer being held by a wafer holder 412 that is likewise illustrated in part.

The radiation source 402 can emit EUV radiation 413, for example in the range of between 5 nanometres and 30 nanometres. Optically differently designed and mechanically adjustable optical elements are used for controlling the radiation path of the EUV radiation 413. In the case of the EUV projection exposure apparatus 400 illustrated in FIG. 1, the optical elements are designed as adjustable mirrors in suitable embodiments, which are mentioned merely by way of example below.

The EUV radiation 413 generated via the radiation source 402 is aligned via a collector integrated in the radiation source 402 in such a way that the EUV radiation 413 passes through an intermediate focus in the region of an intermediate focal plane 414 before the EUV radiation 413 impinges on a field facet mirror 415. Downstream of the field facet mirror 415, the EUV radiation 413 is reflected by a pupil facet mirror 416. With the aid of the pupil facet mirror 416 and an optical assembly 417 having mirrors 418, 419, 420, field facets of the field facet mirror 415 are imaged into the object field 404.

Figure 2:
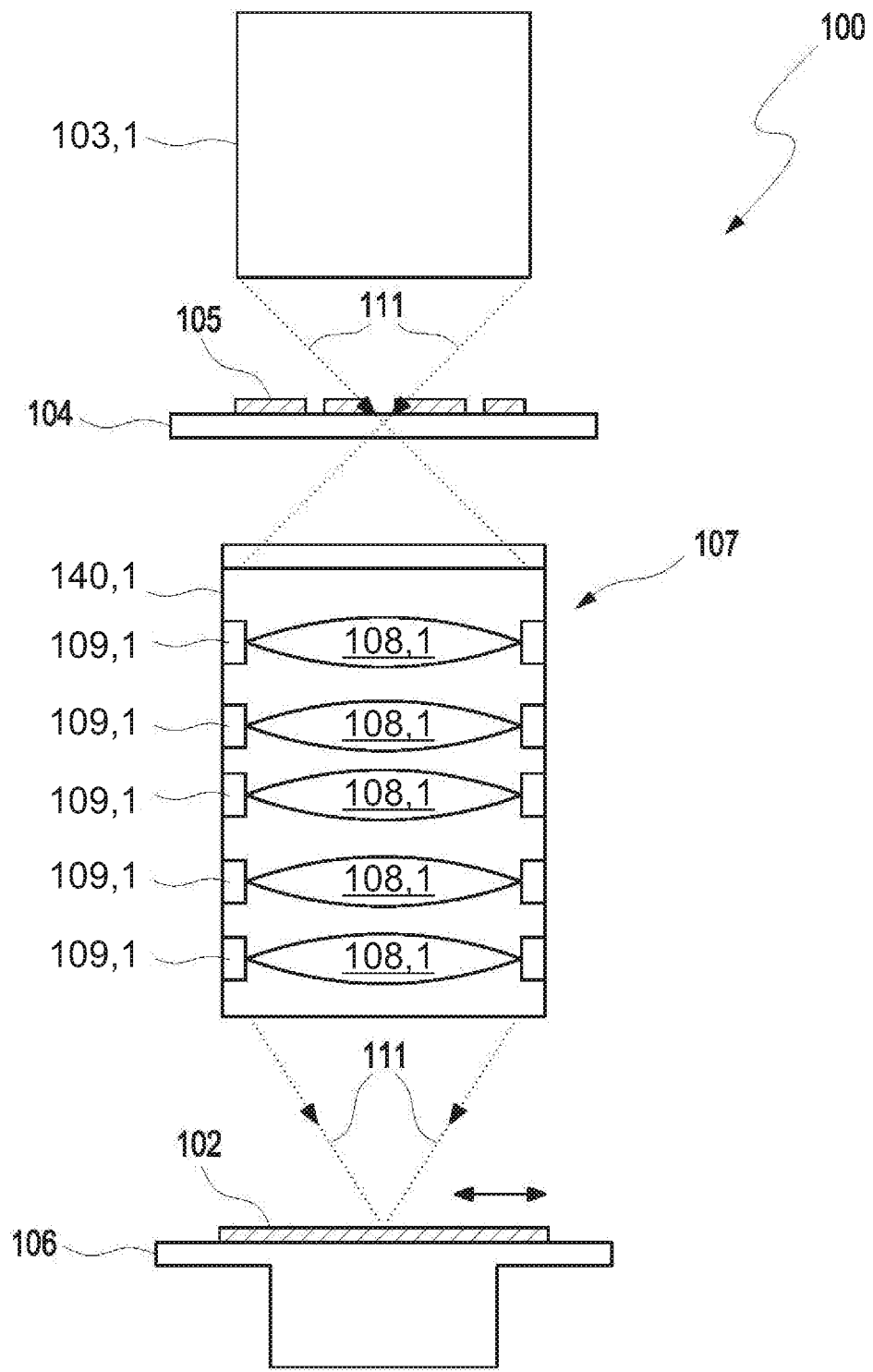
FIG. 2 shows a DUV projection exposure apparatus.

FIG. 2 illustrates an exemplary DUV projection exposure apparatus 100. The projection exposure apparatus 100 comprises an illumination system 103, a device known as a reticle stage 104 for receiving and exactly positioning a reticle 105, by which the later structures on a wafer 102 are determined, a wafer holder 106 for holding, moving and exactly positioning the wafer 102 and an imaging device, to be specific a projection lens 107, with a plurality of optical elements 108, which are held by way of mounts 109 in a lens housing 140 of the projection lens 107.

The optical elements 108 can be designed as individual refractive, diffractive and/or reflective optical elements 108, such as for example lens elements, mirrors, prisms, terminating plates and the like.

The basic functional principle of the projection exposure apparatus 100 provides for the structures introduced into the reticle 105 to be imaged onto the wafer 102.

The illumination system 103 provides a projection beam 111 in the form of electromagnetic radiation, which is used for the imaging of the reticle 105 on the wafer 102. A laser, plasma source or the like can be used as the source of this radiation. The radiation is shaped in the illumination system 103 via optical elements such that the projection beam 111 has the desired properties with regard to diameter, polarisation, shape of the wavefront and the like when it is incident on the reticle 105.

An image of the reticle 105 is generated via the projection beam 111 and transferred from the projection lens 107 to the wafer 102 in an appropriately reduced form. In this case, the reticle 105 and the wafer 102 can be moved synchronously, so that regions of the reticle 105 are imaged onto corresponding regions of the wafer 102 virtually continuously during a so-called scanning process.

Figure 3:
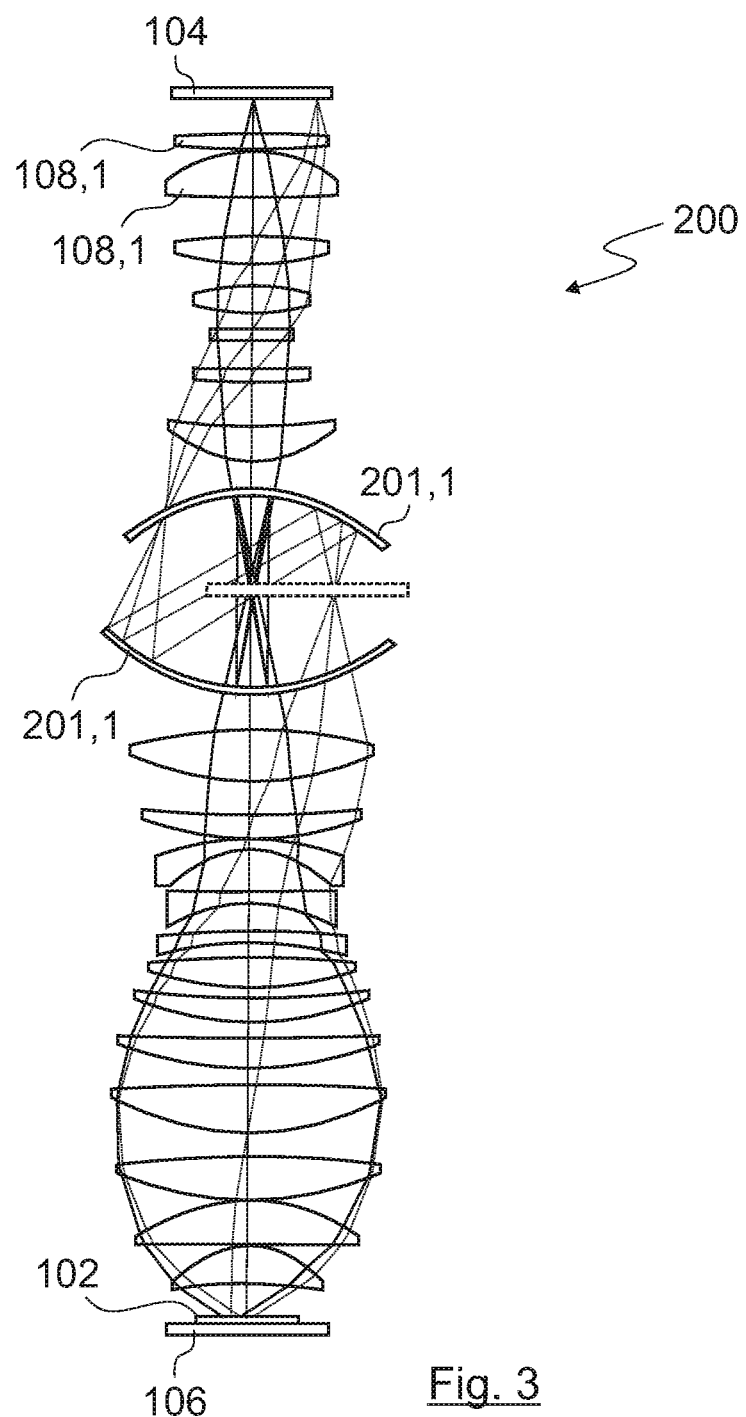
FIG. 3 shows a projection exposure apparatus for immersion lithography.

FIG. 3 illustrates by way of example a third projection exposure apparatus 200 designed as a DUV projection exposure apparatus for immersion lithography. For further background appertaining to such a projection exposure apparatus 200, reference is made to WO 2005/069055 A2, for example, the content of which is incorporated by reference in the following description. Therefore, the exact functioning will not be discussed in detail at this juncture.

In a manner comparable to the DUV projection exposure apparatus 100 in accordance with FIG. 2, a reticle stage 104 is discernible, by which the later structures on the wafer 102 arranged on the wafer holder 106 or wafer stage are determined. For this purpose, the projection exposure apparatus 200 in FIG. 3 likewise has a plurality of optical elements, for example lens elements 108 and mirrors 201.

The method according to the disclosure or the disclosure is not restricted to use in projection exposure apparatuses 100, 200, 400, for example not to projection exposure apparatuses 100, 200, 400 with the set-up described. The method according to the disclosure or the disclosure is suitable, in principle, for the tracking and identification of arbitrary lithography systems, for example of projection exposure apparatuses for semiconductor lithography.

In some embodiments, the disclosure is suitable for EUV projection exposure apparatuses, for example for the purely mechanical components used therein.

The following figures illustrate the disclosure merely by way of example and highly schematically.

Figure 4:
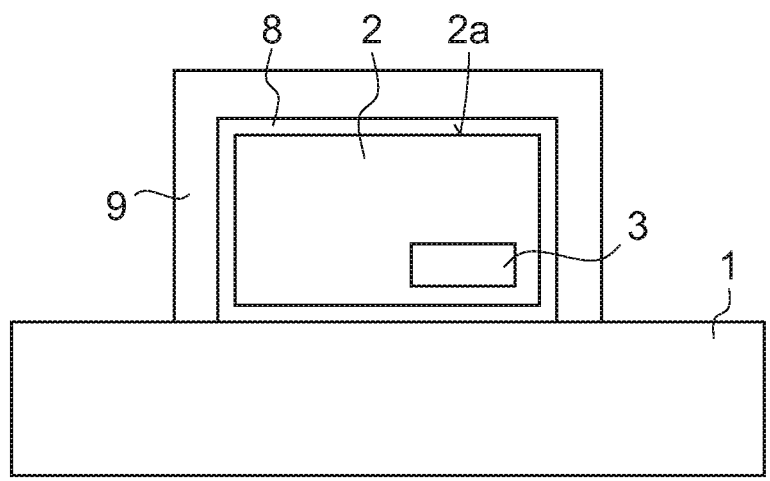
FIG. 4 shows a basic illustration of a component of a lithography system which is provided with a transponder according to the disclosure.
Figure 5:
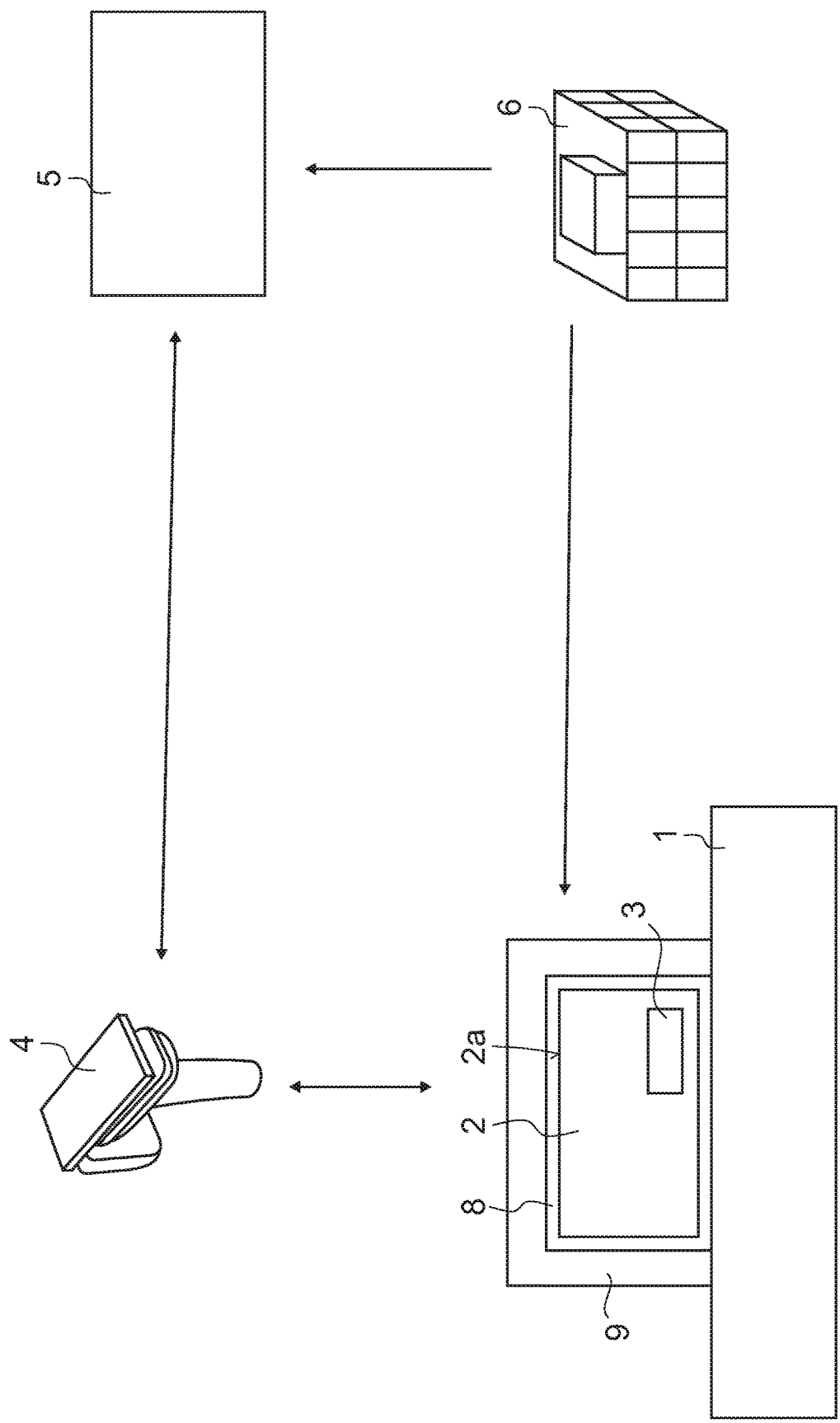
FIG. 5 shows a basic illustration of a method according to the disclosure for the tracking and identification of components of lithography systems.
Figure 6:
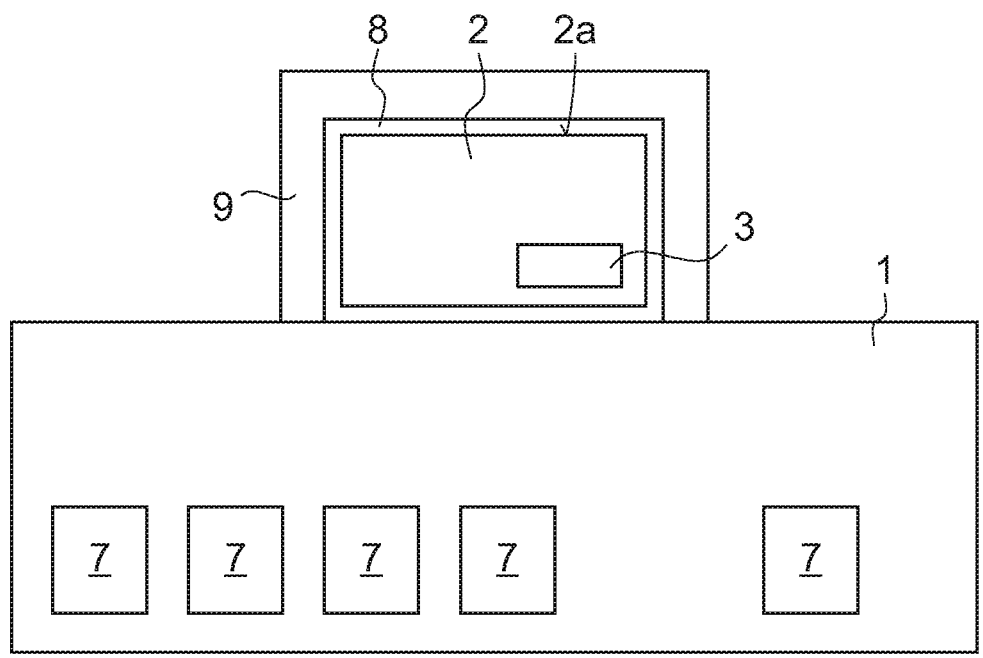
FIG. 6 shows a basic illustration of a component of a lithography system which is provided with a transponder according to the disclosure, where the component has a plurality of subcomponents.

FIG. 4 shows a component 1—also illustrated in FIGS. 5 and 6—of a lithography system, for example of a projection exposure apparatus 100, 200, 400 for semiconductor lithography, as are illustrated by way of example in FIGS. 1, 2 and 3.

In the following, the method according to the disclosure and the lithography system according to the disclosure are illustrated on the basis of a projection exposure apparatus, wherein the disclosure is not restricted thereto. The disclosure with regard to a projection exposure apparatus should be understood such that it is also considered to be a disclosure in general for a lithography system. In this case, for example, devices for inspection and repair of photolithographic masks in the semiconductor industry and devices and systems for process control in the semiconductor industry are also intended to be deemed to be concomitantly disclosed. The method according to the disclosure can be applied in the case of such devices, too.

The component 1 illustrated in FIGS. 4, 5 and 6 is provided with at least one transponder 2 for tracking and identification purposes. In this case, the transponder 2 has data memory 3 and is configured to pick up wirelessly arriving signals of a reader 4 and to respond with data from the data memory 3. Data relating to the component 1 are stored on the data memory 3.

In the context of the disclosure, provision is made for at least one component 1 of the projection exposure apparatus 100, 200, 400 for semiconductor lithography to be provided with a transponder 2. Optionally, a plurality of components 1 of the projection exposure apparatus 100, 200, 400 have a transponder 2. It goes without saying that provision can also be made for all or some of components 1 of the projection exposure apparatus 100, 200, 400 to have a transponder 2.

Components 1 of the projection exposure apparatus 100, 200, 400 which are provided with a transponder 2 are optionally purely mechanical components. A component 1 can also be, for example, one of the optical elements 415, 416, 418, 419, 420, 108, 201, as are illustrated in FIGS. 1 to 3. A component 1 can also be, for example, frames or mounts or other purely mechanical components which, for example, have no electrical parts and no power supply.

Provision can be made for at least one of the optical elements 415, 416, 418, 419, 420, 108, 201 to be designed as a component 1 provided with a transponder 2. In FIGS. 1 to 3, the optical elements are therefore additionally designated by the reference sign 1. However, it is also possible for none of the optical elements 415, 416, 418, 419, 420, 108, 201 to have a transponder 2, rather for other mechanical components 1, such as frames and mounts, for example, to be correspondingly provided with transponders 2. It is also possible, of course, for one, a portion or all of the optical elements and one, a portion or all of the other mechanical components 1 to be provided with a transponder 2, for example certain mechanical components 1 which are relevant for the functionality of the projection exposure apparatus.

In the context of the disclosure, the all components 1 of the projection exposure apparatus 100, 200, 400 which are regarded as relevant components can be provided with a transponder 2 in order to enable tracking and identification.

In the exemplary embodiment, provision is made for the transponder 2 to be designed as a passive transponder.

In the exemplary embodiment, provision is furthermore made for the signals of the reader 4 to be transmitted contactless by radio.

In the exemplary embodiment, provision is made, moreover, for the transponder 2 to be configured to store data arriving via the signals of the reader 4 as desired on the data memory 3. In this respect, reference is made to FIG. 5. The double-headed arrow illustrated therein between the transponder 2 and the reader 4 is intended to symbolize that the reader 4 can be suitable both for transmitting data to the data memory 3 of the transponder 2 and for reading data from the data memory 3 of the transponder 2.

Furthermore, provision is made for the reader 4 also to transmit data to a data network 5, for example a so-called "Cloud", and furthermore also to receive data from the data network 5. This, too, is symbolized by a double-headed arrow in FIG. 5.

The method according to the disclosure as illustrated in the exemplary embodiment furthermore provides for data to be stored on the data memory 3 of the transponder during the production of the component 1 and/or during the production of the projection exposure apparatus 100, 200, 400 and/or after the start-up of the projection exposure apparatus 100, 200, 400. With regard to the transmission of the data during the production of the component 1 and/or during the production of the projection exposure apparatus 100, 200, 400, provision is made for data to be transmitted by a production machine 6, illustrated symbolically in FIG. 5, such that said data can be saved or stored on the data memory 3.

It goes without saying that provision can be made for such data transmission to be effected not only by one production machine 6 but also by a plurality of production machines 6. Provision can be made for data concerning partial processing steps and also concerning finished processing steps to be transmitted to the data memory 3. By way of example, the status and/or the completion of a grinding or polishing process can be stored.

With regard to the transmission of data from the production machine 6 to the data memory 3, reference is made to the single-headed arrow in FIG. 5 between the production machine 6 and the transponder 2.

Alternatively or supplementarily, as likewise illustrated in FIG. 5, provision is also made for the production machine 6 to transmit corresponding data to the data network 5. The transmission of the data from the production machine 6 to the data memory 3 and/or to the data network 5 can be effected as desired or optionally automatically.

As is furthermore illustrated in FIG. 5, it is also possible to effect a data correlation between the data network 5 and the reader 4, in both directions.

A reader 4 for writing and reading data is illustrated merely symbolically in FIG. 5. The reader 4 illustrated in FIG. 5 here has a display. Alternatively, however, provision can also be made, for example, for the reader 4 and the display to be embodied as separate devices. The reader 4 can also be a conventional reader 4, which, for the purpose of displaying the data, communicates with a mobile terminal, for example a laptop or a mobile phone, in order to display the data on the display present therein.

In the exemplary embodiment, provision is made for optionally one or more of the following items of information to be stored in the data memory 3:
- data concerning the identification of the type of component 1;
- Actual data of the production of the component 1;
- data relating to an individualization and/or a customized adaptation of the component 1,
- data relating to the association with the component 1 with a specific projection exposure apparatus, for example an individualized projection exposure apparatus and/or a projection exposure apparatus configured in a customized manner;
- data relating to properties of the component 1 with which the latter deviates from other components 1 of the same type within the specifications;
- measurement data of the component 1;
- data relating to a general overhaul, an improvement, a conversion, a renovation or a retrofitting of the component 1;
- data relating to the service, the start-up, the repair and/or the maintenance of the component 1;
- data relating to production steps of the component 1;
- data relating to the material or materials of the component 1;
- data relating to the calibration of the component 1;
- data relating to the processing of the component 1;
- data relating to production features;
- data relating to product features;
- data relating to subcomponents 7 of the component 1;
- data relating to the hardware of the component 1 and/or the type, the configuration, the arrangement, the processing or the state of the subcomponents 7 of the component 1;
- data relating to suppliers;
- data relating to customers;
- data relating to additional information;
- the number of the component 1 allocated in a merchandise management system.

In the exemplary embodiment, alternatively or supplementarily with regard to the information to be stored on the data memory 3, provision can be made for one, a plurality or all of the aforementioned data (which can optionally be stored for the component 1) are also stored on the data memory 3 for one subcomponent 7, a plurality of subcomponents 7, a group of subcomponents 7 or all of the subcomponents 7 of the component 1.

In the exemplary embodiment, provision can be made for individual, a plurality or all of the data to be read from the data memory 3 during the production of the component 1 and/or during the production of the projection exposure apparatus 100, 200, 400 and/or after the start-up of the projection exposure apparatus 100, 200, 400. FIG. 5 illustrates here only (symbolized by the double-headed arrow) the read-out of the data after the start-up of the projection exposure apparatus 100, 200, 400 with the aid of the reader 4.

In a manner not illustrated in more specific detail, however, provision can also be made to the effect that, as explained, during the production of the component 1 and/or during the production of the projection exposure apparatus 100, 200, 400, data are read from the data memory 3, for example in order to store them in the data network 5 or to make them available to the production machine 6. As a result, it is possible for example to check whether the correct component 1 was incorporated into a specific projection exposure apparatus 100, 200, 400, what the status is or which processing steps have already been concluded or are still open or whether all of the subcomponents 7 have already been incorporated or which subcomponents 7 are still missing. For the purpose of reading out the data during the production of the component 1 and/or the projection exposure apparatus 100, 200, 400, a conventional scanner can be used; optionally, provision can also be made here for the production machine 6 or the production machines 6 to be correspondingly equipped to read out the data.

FIG. 6 illustrates some subcomponents 7 of a component 1 by way of example. In principle, any desired number of subcomponents 7 can be incorporated in the component 1.

Optionally, here the number of subcomponents 7 can be in the thousands. In the context of the method according to the disclosure, provision is optionally made here for the data concerning the subcomponents 7 likewise to be stored on the data memory 3 of the transponder 2 of the component 1.

In the exemplary embodiment, provision is made for the transponder 2 to be secured to the component 1 by a method suitable for a vacuum environment and/or a clean room. This is symbolized in FIGS. 4 to 6 by the securing 9 illustrated therein.

As is evident from FIG. 5, in the method illustrated in the exemplary embodiment, provision is made for the data read by the reader 4 to be transmitted to the data network 5 and/or for additional information concerning the component 1 optionally to be retrieved from the data network 5. The exchange of the data between the reader 4 and the data network 5 can be effected here at the same time or merely the same time as the read-out of the data from the data memory 3 or at a later point in time, for example if the projection exposure apparatus 100, 200, 400 is installed at a location at which it is not possible to establish a data connection to the data network 5. In this case, the data correlation between the reader 4 and the data network 5 can be effected as desired or automatically.

In the exemplary embodiment, provision is made for the data which was stored in the data network 5 and/or the data memory 3 during the production of the component 1 and/or the production of the projection exposure apparatus 100, 200, 400 to be transmitted to the reader 4 as desired or automatically.

In the exemplary embodiment, provision is made for at least one portion of the data stored on the data memory 3 to be stored in an encoded manner. Optionally, all the data are stored on the data memory 3 in an encoded manner.

Optionally, provision is made for the data transmitted from the transponder 2 to the reader 4 to be decrypted on the reader 4. In this case, provision can also be made for the decryption not to be effected on the reader 4, but rather on a mobile terminal corresponding to the reader 4, for example a laptop or a mobile phone, on the display of which the data are then optionally displayed in clear text.

In the exemplary embodiment, provision is made for the transponder 2 to be designed for use in a vacuum environment and/or a clean room. For this purpose, the transponder can be provided with a mechanical protection. In the exemplary embodiment, for this purpose, provision is made for a coating 8 to be applied to at least one portion of the outer surface 2a of the transponder 2. In the exemplary embodiment, the coating 8 surrounds or encompasses the transponder 2 completely. Alternatively, the transponder 2 can also be potted.

Furthermore, in the exemplary embodiment in accordance with FIGS. 4 to 6, provision is made for the transponder 2 to be secured to the component 1 by a method suitable for a vacuum environment and/or a clean room.

In the exemplary embodiment, provision is made for the transponder 2 to be a transponder 2 designed for near field communication. In the exemplary embodiment, this involves, for example, an RFID transponder 2 configured in such a way that the latter can be both read from and written to repeatedly.

The description of the method according to the disclosure in the context of the exemplary embodiments also serves for the disclosure of a corresponding lithography system or of a projection exposure apparatus 100, 200, 400 in which components 1 are provided with a transponder 2.

LIST OF REFERENCE SIGNS

1 Component
2 Transponder
2a Outer surface of the transponder
3 Data memory
4 Reader
5 Data network
6 Production machine
7 Subcomponent
8 Coating
9 Securing
100 Projection exposure apparatus
102 Wafer
103 Illumination system
104 Reticle stage
105 Reticle
106 Mounting device
107 Projection lens
108 Optical element
109 Mount
111 Projection beam
140 Lens housing
200 Projection exposure apparatus
201 Mirror
400 Projection exposure apparatus
401 Illumination system
402 Radiation source
403 Optical unit
404 Object field
405 Object plane
406 Reticle
407 Reticle holder
408 Projection optical unit
409 Image field
410 Image plane
411 Wafer
412 Wafer holder
413 EUV radiation
414 Intermediate focal plane
415 Field facet mirror
416 Pupil facet mirror
417 Optical assembly
418 Mirror
419 Mirror
420 Mirror

What is claimed is:

1. A method of tracking and identifying components of a lithography system, each component comprising a transponder, each transponder comprising data memory configured to store data relating to the component, each transponder configured to wirelessly pick up arriving signals of a reader and to respond with data from its data memory, each component being a mechanical component without electrical parts and/or without a power supply, the method comprising:
for each component, repeatedly storing the data relating to the component in the data memory of its transponder during production of the component, production of the lithography system, and/or after start-up of the lithography system.

2. The method of claim 1, wherein, for each component, the transponder comprises a passive transponder.

3. The method of claim 1, comprising transmitting the signals of the reader via radio.

4. The method of claim 1, wherein the transponder stores the data arriving via the signals of the reader and/or a transmitter in the data memory.

5. The method of claim 1, comprising storing at least one of the following items of information in the data memory:
data concerning the identification of a type of component;
actual data of the production of the component;
data relating to an individualization and/or a customized adaptation of the component;
data relating to the association with the component with a specific lithography system;
data relating to properties of the component with which the component deviates from other components of the same type within specifications;
measurement data of the component;
data relating to a general overhaul, an improvement, a conversion, a renovation or a retrofitting of the component;
data relating to the service, the start-up, the repair and/or the maintenance of the component;
data relating to production steps of the component;
data relating to the material or materials of the component;
data relating to the calibration of the component;
data relating to the processing of the component;
data relating to production features;
data relating to product features;
data relating to subcomponents of the component;
data relating to hardware of the component, and/or a type, a configuration, an arrange-ment, a processing, or a state of subcomponents of the component;
data relating to suppliers;

data relating to customers;
data relating to additional information; and
a number of the component allocated in a merchandise management system.

6. The method of claim 5, further comprising storing in the data memory a plurality the at least one items in the data memory for at least one subcomponent of the component.

7. The method of claim 1, further comprising reading the data from the data memory during the production of the component, during the production of the lithography system, and/or after the start-up of the lithography system.

8. The method of claim 1, further comprising reading out the data for at least one member selected from the group consisting of service purposes, when an overhaul occurs, when a repair occurs, when maintenance occurs, when error messages occur, during the production process to ascertain which components have already been installed, to ascertain what status the component has, to ascertain whether a specific lithography system has been provided with the associated components.

9. The method of claim 1, further comprising securing the transponder to the component using a method suitable for a vacuum environment and/or using a clean room.

10. The method of claim 1, further comprising applying mechanical protection to at least one portion of the outer surfaces of the transponder.

11. The method of claim 1, further comprising potting the transponder or coating the transponder.

12. The method of claim 1, further comprising storing, in an encoded manner at least one portion of the data stored in the data memory.

13. The method of claim 1, wherein the data read out by the reader are transmitted to a data network and/or additional information concerning the component is retrieved from the data network.

14. The method of claim 13, wherein data acquired during the production of the component and/or the production of the lithography system are stored in the data network and/or the data memory and are transmitted to the reader as desired or automatically.

15. The method of claim 1, wherein the transponder comprises a near field communication transponder.

16. The method of claim 1, wherein, for each component, the transponder comprises a passive transponder, and the method comprising transmitting the signals of the reader via radio.

17. The method of claim 1, wherein, for each component, the transponder comprises a passive transponder, and the transponder storing the data arriving via the signals of the reader and/or a transmitter in the data memory.

18. A lithography system, comprising:
an illumination system comprising a radiation source and an optical unit, the optical unit comprising a plurality of components, a component comprising a transponder, the transponder comprising a data memory in which data relating to the component are stored, the transponder configured to pick up wirelessly arriving signals of a reader and to respond with data from the data memory, the components being mechanical components having no electrical parts and/or having no power supply, the data having been repeatedly stored in the data memory during the production of the component, during the production of the lithography system, and/or after start-up of the lithography system.

19. The lithography system of claim 18, wherein at least some of the components comprise optical elements.

20. A method of tracking and identifying components of a lithography system, each component comprising a transponder, each transponder comprising data memory configured to store data relating to the component, each transponder configured to wirelessly pick up arriving signals of a reader and to respond with data from its data memory, each component being a mechanical component without electrical parts and/or without a power supply, the method comprising:
for each component, storing the data relating to the component in the data memory of its transponder during production of the component, production of the lithography system, and/or after start-up of the lithography system; and
reading the data from the data memory during the production of the component, during the production of the lithography system, and/or after the start-up of the lithography system.

21. A method of tracking and identifying components of a lithography system, each component comprising a transponder, each transponder comprising data memory configured to store data relating to the component, each transponder configured to wirelessly pick up arriving signals of a reader and to respond with data from its data memory, each component being a mechanical component without electrical parts and/or without a power supply, the method comprising:
for each component, storing the data relating to the component in the data memory of its transponder during production of the component, production of the lithography system, and/or after start-up of the lithography system; and
reading out the data for at least one member selected from the group consisting of service purposes, when an overhaul occurs, when a repair occurs, when maintenance occurs, when error messages occur, during the production process to ascertain which components have already been installed, to ascertain what status the component has, to ascertain whether a specific lithography system has been provided with the associated components.

* * * * *

UNITED STATES PATENT AND TRADEMARK OFFICE
CERTIFICATE OF CORRECTION

PATENT NO. : 11,927,888 B2
APPLICATION NO. : 17/811937
DATED : March 12, 2024
INVENTOR(S) : Michael Kamp-Froese and Claudia Woersching It is certified that error appears in the above-identified patent and that said Letters Patent is hereby corrected as shown below:

In the Specification

Column 1, Line 10, delete "USC" and insert -- U.S.C. --.

Column 1, Line 10, after "application" insert -- No. --.

Column 1, Line 12, delete "USC" and insert -- U.S.C. --.

Column 3, Line 63, delete "have have" and insert -- have --.

Column 15, Line 33, delete "component 1," and insert -- component 1; --.

In the Claims

Column 18, Line 65, Claim 5, delete "arrange-ment," and insert -- arrangement, --.

Column 19, Line 6, Claim 6, after "plurality" insert -- of --.

Signed and Sealed this
Fourth Day of June, 2024

Katherine Kelly Vidal
Director of the United States Patent and Trademark Office